United States Patent [19]

French

[11] Patent Number: 4,529,427
[45] Date of Patent: Jul. 16, 1985

[54] METHOD FOR MAKING LOW-LOSS OPTICAL WAVEGUIDES ON AN INDUSTRIAL SCALE

[75] Inventor: William G. French, Plainfield, N.J.

[73] Assignee: AT&T Bell Laboratories, Murray Hill, N.J.

[21] Appl. No.: 1,155

[22] Filed: Jan. 5, 1979

Related U.S. Application Data

[63] Continuation of Ser. No. 798,350, May 19, 1977, abandoned.

[51] Int. Cl.³ .......................... C03C 25/04; B05B 1/24
[52] U.S. Cl. ........................................ 65/3.12; 65/13; 65/18.1; 427/163; 427/237; 427/255.1; 239/79; 239/428
[58] Field of Search ...................... 65/2, 3 A, 18, 13; 23/284, 253 PC; 427/237, 163, 248 C; 261/18 R, 141; 239/79, 428

[56] References Cited

U.S. PATENT DOCUMENTS

| | | | |
|---|---|---|---|
| 1,879,551 | 9/1932 | Shoemaker | 261/141 X |
| 2,377,607 | 6/1945 | Bodine | 261/18 R X |
| 2,406,913 | 9/1946 | Serrano | 261/18 R X |
| 3,854,881 | 12/1974 | Cohen | 23/284 |
| 3,904,449 | 9/1975 | DiLorenzo | 148/175 |
| 3,980,459 | 9/1976 | Li | 65/18 |

OTHER PUBLICATIONS

Glass Fibers for Optical Communications Annual Review of Materials Science vol. 5, 1975 pp. 373-394.

*Primary Examiner*—Robert L. Lindsay, Jr.
*Attorney, Agent, or Firm*—Peter A. Businger

[57] ABSTRACT

A method is disclosed for making an optical fiber by drawing a preform whose fabrication involves deposition of a glass on a substrate by means of a chemical reaction between gaseous reagents. According to the disclosed method, accurately controlled amounts of a gaseous reagent are produced by flash evaporating a metered flow of a liquid reagent. The disclosed method is of particular interest for the industrial production of optical fibers.

14 Claims, 2 Drawing Figures

METHOD FOR MAKING LOW-LOSS OPTICAL WAVEGUIDES ON AN INDUSTRIAL SCALE

This application is a continuation of application Ser. No. 798,350, filed May 19, 1977, now abandoned.

BACKGROUND OF THE INVENTION

1. Field of the Invention

The invention is concerned with the fabrication of optical fibers.

2. Description of the Prior Art

A promising approach to the fabrication of optical waveguides on an industrial scale involves the preparation of a preform in the form of a glass rod, followed by drawing a fiber from the rod.

The perform may consist of a single, homogeneous glass, it may consist of two glasses of which one forms a core and the other a cladding, or it may consist of several coaxial cylindrical layers of glasses. As compared with its preform, a drawn fiber has greatly reduced diameter but identical compositional structure.

Effective light guiding in an optical fiber requires a structure in which an optically transparent core material is surrounded by another material whose refractive index is less than that of the core material. Such structure may be achieved by coating or sheathing a drawn fiber or by an appropriate choice of preform core and cladding glasses. For example, pure silica may be used as a cladding glass in combination with germanium oxide, phosphorous oxide or titanium oxide doped silica as a core glass. Or, pure silica may be used as a core glass in combination with boron doped silica as a cladding glass. Other glass compositions such as sodium borosilicates and sodium lime silicates have also been studied in this context.

While fibers composed of one or two glasses are well suited for single-mode transmission, fibers for multimode transmission are preferably made of a great number of coaxial glass layers whose refractive index varies essentially continuously and preferably according to an optimal grading. Either type of fiber may be made by drawing techniques described in the paper by William G. French, John B. MacChesney, and A. David Pearson, on "Glass Fibers for Optical Communications" which appeared in the *Annual Review of Materials Science*, Vol. 5, 1975, pages 373-394.

For the manufacture of a preform a number of methods have been proposed. One method, known as "soot process" is based on the deposition of microscopic glass particles on a substrate at relatively low temperatures, followed by heat fusing the resulting layer of particles. For example, a mixture of $SiCl_4$ and $TiCl_4$ vapors may be hydrolized in a gas-oxygen burner to deposit glass particles on the inside of a silica tube. The particles are subsequently heat fused and the resulting assembly is collapsed into a rod-shaped preform having a titanium-doped silica core and a pure silica cladding. The soot process may also be used to build up glass deposits on the outside of a tube or solid mandrel which, after deposition and fusing, may be removed if required, by chemical etching or mechanical core drilling, respectively.

Alternate methods for making a preform are disclosed in U.S. patent applications Ser. No. 444,705, filed on Oct. 23, 1973, and Ser. No. 670,162, filed on Mar. 25, 1976, both now abandoned. Application Ser. No. 444,705, by J. B. MacChesney and P. B. O'Connor, and entitled "Optical Fiber Fabrication and Resulting Product" calls for directing a flow of a gaseous mixture of reagents into a tube which is heated externally by a moving hot zone. Glass particles produced as a result of a homogeneous chemical reaction in the gaseous mixture as well as a glass formed directly on the substrate by heterogeneous reaction are deposited on the inside of the tube and are fused into a continuous layer of glass. Application Ser. No. 670,162 by R. E. Jaeger, J. B. MacChesney, and T. J. Miller, and entitled "Modified Chemical Vapor Deposition of an Optical Fiber Using an rf Plasma", calls for directing a flow of a gaseous mixture of reagents into a tube and depositing glass on the inside of the tube as a result of a chemical reaction taking place in a radio frequency plasma. A method has also been proposed in which a chemical reaction takes place in a microwave frequency plasma.

One feature shared by these methods is the need for precisely proportioned mixtures of gaseous reagents. While it has been possible to produce such mixtures by carefully regulating flows of reagent gases under laboratory conditions, difficulties have arisen in adapting this approach to the production of highly uniform fibers in an industrial setting. These difficulties may be compared with those encountered in the manufacture of GaAs Schottky barrier diodes where it is necessary to supply precisely controlled bursts of dopant reagents to chemical vapor deposition apparatus. U.S. Pat. No. 3,904,449 issued on Sept. 9, 1975 to J. V. DiLorenzo and L. C. Luther and assigned to the present assignee, discloses a method which achieves such control by injecting into a carrier gas a predetermined volume of a gaseous dopant reagent at predetermined pressure.

SUMMARY OF THE INVENTION

The invention is a method for making optical fibers to within narrow compositional tolerances. The method consists in drawing a preform which is made by depositing one or several layers of glass on a substrate by means of a chemical reaction between gaseous reagents. The method calls for supplying a mixture of reagent gases whose composition is precisely controlled by metering a reagent in liquid form followed by flash evaporating the metered liquid.

DETAILED DESCRIPTION OF THE DRAWING

Figure 1:
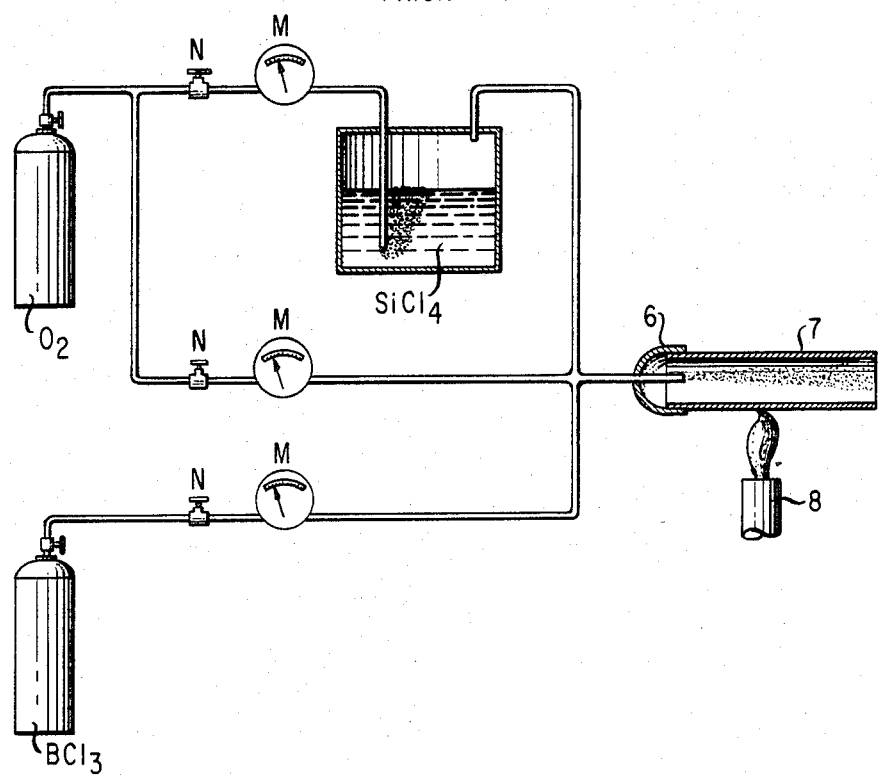
FIG. 1 is a schematic view of prior art apparatus in which bubbling apparatus is used.

FIG. 1 shows supplies of gaseous reagents $O_2$ and $BCl_3$ and supply of liquid $SiCl_4$. Gaseous reagents are regulated by means of needle valves N and metered by means of meters M. A metered flow of oxygen is bubbled through supply of liquid reagent $SiCl_4$. Reagents are admixed and fed through swivel connector 6 to hollow substrate 7 which is heated by burner 8.

Figure 2:
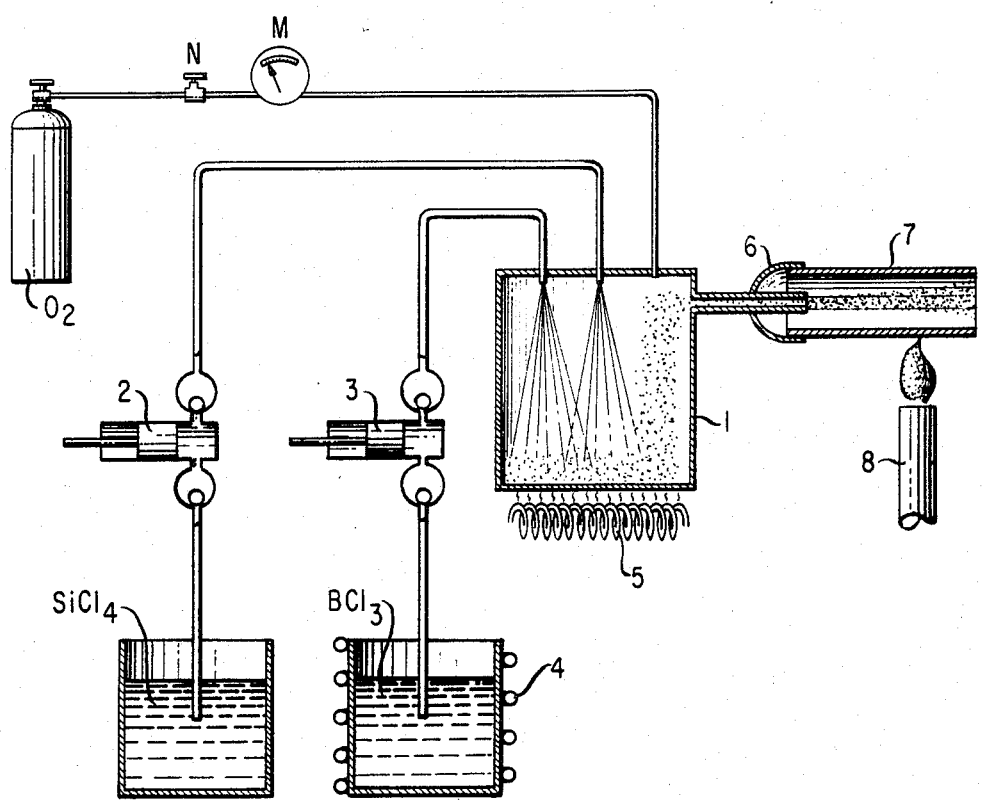
FIG. 2 is a schematic view of apparatus for chemical vapor deposition in which two reagents are metered in liquid form and which is suited for the manufacture of preforms on an industrial scale.

FIG. 2 shows supplies of liquid $SiCl_4$ and $BCl_3$ and supply of gaseous $O_2$ connected to flash evaporation chamber 1. Liquid reagents are supplied to chamber 1 by metering pumps 2 and 3, respectively. Flow of $O_2$ is regulated by needle valve N and measured by meter M. Supply of $BCl_3$ is cooled by cooling coils 4. Flash evaporation chamber 1 is heated by heater 5. Gaseous mixture of reagents is fed through swivel connector 6 to hollow substrate 7 which is heated by burner 8.

The present method relies on feeding precisely metered amounts of a liquid reagent such as a chloride, bromide, or oxychloride of a glass constituent element such as B, Ge, P, Si, or Ti, to a flash evaporation chamber to produce a well controlled gaseous mixture of reagents. Reagents such as $BCl_3$ which are gaseous at room temperature may be liquified by cooling prior to metering. Similarly, it is possible to supply a metered flow of liquid oxygen to the evaporation chamber. However, since precise metering of the oxygen flow is less important for purposes of glass deposition and since, in fact, oxygen is preferably utilized in excess of the stoichiometric amount, oxygen may satisfactorily be supplied in the form of a gaseous flow controlled, e.g., by a needle valve and metered by a gas flow meter as shown in FIG. 2. Metering of liquid reagents may be conveniently carried out by metering pumps as shown in FIG. 2. Alternately, a metered flow may be produced by a controlled gravity feed.

Mixing of constituent reagents may occur after evaporation as shown in FIG. 2 or, where two or more reagents are supplied in liquid form, such reagents may be mixed in liquid form either before of after the metering step. For example, $SiCl_4$ as a first reagent may be conveniently premixed with reagents such as $BBr_3$, $PCl_3$, $TiCl_4$, or $GeCl_4$ in liquid form and in the exact proportion desired. Premixing of liquid reagents prior to the metering step is most appropriate for the fabrication of preforms for fibers consisting of at most a few glasses of different composition. For the deposition of a great number of glasses as required in the fabrication of graded index fibers, it is preferable to meter constituent reagents individually and prior to mixing in either liquid or gaseous form.

EXAMPLE

An optical fiber was produced by drawing a preform manufactured by depositing borosilicate glass inside a pure silica tube having an inner diameter of 14 mm. The tube was heated externally by four hydrogen-oxygen burners and rotated continuously to prevent sagging. A flow of 0.73 gm/min liquid $SiCl_4$ was supplied by a metering pump to a flash evaporation chamber into which gaseous flows of 600 cc/min oxygen and 23 cc/min $BCl_3$ were fed in addition to the flow of liquid $SiCl_4$ to produce the desired gaseous mixture. The mixture was fed via a ballast tank and a swivel head to the rotating tube. A borosilicate glass layer 0.5 mm thick was deposited on the inside of the tube. Subsequently, the supply of $BCl_3$ was turned off and a layer of pure silica was deposited over the borosilicate layer. The resulting assembly was collapsed and drawn into a pure silica core, borosilicate clad fiber having a pure silica jacket.

What is claimed is:

1. A method for fabricating an optical fiber by drawing a preform whose manufacture comprises depositing a glass on a substrate by means of a chemical reaction between at least two reagents forming a gaseous mixture, characterized in that the preparation of said gaseous mixture comprises the steps of (1) supplying at least a first of said reagents in liquid form, (2) supplying a precisely metered flow of said first of said reagents to a flash evaporation chamber, and (3) flash evaporating said flow in said flash evaporation chamber.

2. Method of claim 1 in which said flow is produced by a metering pump.

3. Method of claim 1 in which said flow is produced by a gravity feed.

4. Method of claim 1 in which said first of said reagents is selected from the group consisting of $BBr_3$, $BCl_3$, $GeBr_4$, $GeCl_4$, $PBr_3$, $PCl_3$, $POCl_3$, $SiBr_4$, $SiCl_4$, and $TiCl_4$.

5. Method of claim 1 in which at least two of said reagents are supplied in liquid form.

6. Method of claim 5 in which said two of said reagents are mixed in liquid form.

7. Method of claim 1 in which said chemical reaction is caused by flame hydrolysis.

8. Method of claim 1 in which said substrate is a tube which is externally heated and into which said mixture is fed.

9. Method of claim 1 in which said glass is deposited by plasma deposition.

10. Method of claim 1 in which said fiber is a graded index fiber.

11. A method for fabricating an optical fiber by drawing a preform whose manufacture comprises depositing a glass on a substrate by means of a chemical reaction between at least two reagents forming a gaseous mixture, characterized in that the preparation of said gaseous mixture comprises the steps of (1) liquifying at least a first of said reagents by refrigeration to a temperature which is less than the boiling temperature and which is greater than the freezing temperature of said first of said reagents, (2) supplying a precisely metered flow of said first of said reagents to a flash evaporation chamber, and (3) flash evaporating said flow in said flash evaporation chamber.

12. Method of claim 11 in which said flow is produced by a metering pump.

13. Method of claim 11 in which said flow is produced by a gravity feed.

14. Method of claim 11 in which said first of said reagents is $BCl_3$.

* * * * *